(12) United States Patent
Wasily

(10) Patent No.: US 8,196,087 B2
(45) Date of Patent: Jun. 5, 2012

(54) CHIP AREA OPTIMIZED PADS

(75) Inventor: Nabil Yousef Wasily, Foothill Ranch, CA (US)

(73) Assignee: Newport Media, Inc., Lake Forest, CA (US)

( * ) Notice: Subject to any disclaimer, the term of this patent is extended or adjusted under 35 U.S.C. 154(b) by 318 days.

(21) Appl. No.: 12/760,442

(22) Filed: Apr. 14, 2010

(65) Prior Publication Data

US 2011/0254166 A1    Oct. 20, 2011

(51) Int. Cl.
*G06F 17/50*    (2006.01)

(52) U.S. Cl. ......... 716/135; 716/119; 716/122; 257/773

(58) Field of Classification Search ........................ None
See application file for complete search history.

(56) References Cited

U.S. PATENT DOCUMENTS

| 5,498,767 | A | * | 3/1996 | Huddleston et al. | 716/122 |
| 5,777,354 | A | * | 7/1998 | Cheung et al. | 257/202 |
| 5,943,285 | A | * | 8/1999 | Kohno | 365/230.03 |
| 6,457,157 | B1 | * | 9/2002 | Singh et al. | 716/122 |
| 6,721,933 | B2 | * | 4/2004 | Iwasa | 257/203 |

* cited by examiner

*Primary Examiner* — Leigh Garbowski
(74) *Attorney, Agent, or Firm* — Rahman LLC

(57) ABSTRACT

An optimized semiconductor chip pad configuration. The pad includes a pad circuit area Ap, a first dimension x and a second dimension y, in a chip having N number of pins on each side. The pins include a longitudinal axis, and the chip includes a chip core of length Lc. The method includes determining the first dimension x by dividing the length Lc by the N, determining the second dimension y by dividing the pad circuit area Ap by a result of a division of the length Lc by the N, and creating a semiconductor area pad that includes pins with the longitudinal axis positioned parallel to the chip core. A stack of circuits is designed in the chip to fit in the pad based on the first dimension x and the second dimension y.

20 Claims, 6 Drawing Sheets

CHIP AREA OPTIMIZED PADS

BACKGROUND

1. Technical Field

The embodiments herein generally relate to integrated circuits (IC's), and, more particularly, to optimizing chip pad area in integrated circuits.

2. Description of the Related Art

Chip pads are normally optimized in shape to fit as many pads as possible in a chip pad ring (area around the silicon core). Typically, the dimensions of the chip pads, particularly, the length (L) is kept as long as possible. This is done to facilitate access by external means during the course of IC fabrication. As an example, a chip pad is designed with a larger length that is sufficient to facilitate an IC packaging process where metal wires are bonded to the chip pads via mechanical means.

FIG. 1 illustrates a traditional pin count pad 100. The pin count pad 100 includes dimensions L and W. L is the length of the pad and W is the width of the pad. The pad 100 includes stack of circuits 102, and long electrostatic discharge (ESD) cells 104. Since, the chip pad includes long ESD cells 104, the length of the pad 100 is relatively large as shown in FIG. 1.

FIG. 2 illustrates a traditional integrated circuit chip (IC) having the pin count pads 100, the stack of circuits 102, and the long ESD cells 104 of FIG. 1, as well as a chip core 202, and a wasted area 204 (i.e., an area unoccupied by circuitry or I/O elements). The pin count pads 100 are mounted along the chip core 202. However, for chips with few numbers of pins, it results in wasting large portion of area (e.g., the wasted area 204) of the silicon area as pads are sparse in a chip pad ring. Accordingly, there remains a need for a re-layout that will optimize the silicon chip area.

SUMMARY

In view of the foregoing, an embodiment herein provides a method of optimizing a semiconductor chip pad configuration. The pad includes a pad circuit area Ap, a first dimension x and a second dimension y, in a chip having N number of pins on each side. The pins include a longitudinal axis, and the chip includes a chip core of length Lc. The method includes determining the first dimension x by dividing the length Lc by the N, determining the second dimension y by dividing the pad circuit area Ap by a result of a division of the length Lc by the N, and creating a semiconductor area pad that includes pins with the longitudinal axis positioned parallel to the chip core. A stack of circuits is designed in the chip to fit in the pad based on the first dimension x and the second dimension y.

The pad includes a length equal to approximately $\frac{1}{6}$ a width of the chip core. The pad includes a length equal to approximately $\frac{1}{6}$ a length of the chip core. The pad includes electrostatic discharge (ESD) cells having a length equal to approximately $\frac{1}{16}$ a length of said chip core. The pad includes electrostatic discharge (ESD) cells having a length equal to approximately $\frac{1}{16}$ a width of the chip core. The first dimension x is in a direction perpendicular to the chip core. The second dimension y is in a direction parallel to the chip core. The semiconductor chip pad configuration is configured in a handheld device.

In another aspect, an integrated circuit including a semiconductor core of length Lc, a plurality of sides of the core each having N number of pins, and a plurality of semiconductor area chip pads is provided. Each pad includes a first dimension x that is determined by dividing the length Lc by the N, and a second dimension y that is determined by dividing an area of the pad Ap by a result of a division of the length Lc by the N. A stack of circuits that fit in the pad based on the first dimension x and the second dimension y. The pins include a longitudinal axis positioned parallel to said semiconductor core.

The pad includes a length equal to approximately $\frac{1}{6}$ a width of the chip core, and a length equal to approximately $\frac{1}{6}$ a length of the chip core. The pad further includes electrostatic discharge (ESD) cells having a length equal to approximately $\frac{1}{16}$ a length of the chip core, and a length equal to approximately $\frac{1}{16}$ a width of the chip core. The first dimension x is in a direction perpendicular to the semiconductor core. The second dimension y is in a direction parallel to the semiconductor core.

In yet another aspect, a semiconductor area optimized integrated circuit chip pad having an area Ap mounted in a chip having N number of pins on each side is provided. The chip includes a semiconductor core of length Lc. The semiconductor area optimized pad includes a first dimension x that is determined by dividing the length Lc by the N, and a second dimension y that is determined by dividing the area of the semiconductor area optimized pad Ap by a result of a division of the length Lc by the N. The pins include a longitudinal axis positioned parallel to the semiconductor core. The chip further includes a stack of circuits that fit in the semiconductor area optimized pad based on the first dimension x and the second dimension y.

The first dimension x is in a direction perpendicular to the semiconductor core. The second dimension y is in a direction parallel to the semiconductor core. The pad includes a length equal to approximately $\frac{1}{6}$ a width of the semiconductor core. The pad includes a length equal to approximately $\frac{1}{6}$ a length of the semiconductor core. The pad further includes electrostatic discharge (ESD) cells having a length equal to approximately $\frac{1}{16}$ a length of the semiconductor core. The pad includes electrostatic discharge (ESD) cells having a length equal to approximately $\frac{1}{16}$ a width of the semiconductor core These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
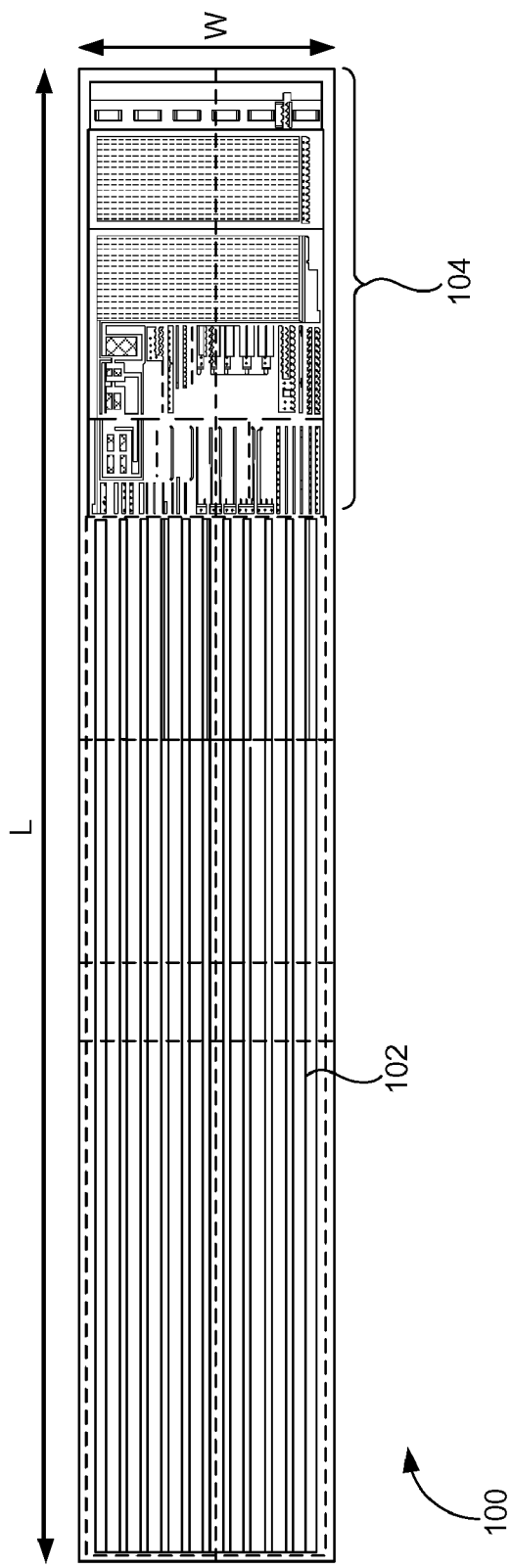
FIG. 1 illustrates a traditional pin count pad.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need to re-layout an IC chip that will optimize the silicon chip area. The embodiments herein achieve this by providing a horizontally configured pin area instead of a vertically configured pin area. Referring now to the drawings, and more particularly to FIGS. 3A through 5, where similar reference characters denote corresponding features consistently throughout the figures, there are shown preferred embodiments.

Figure 3A:
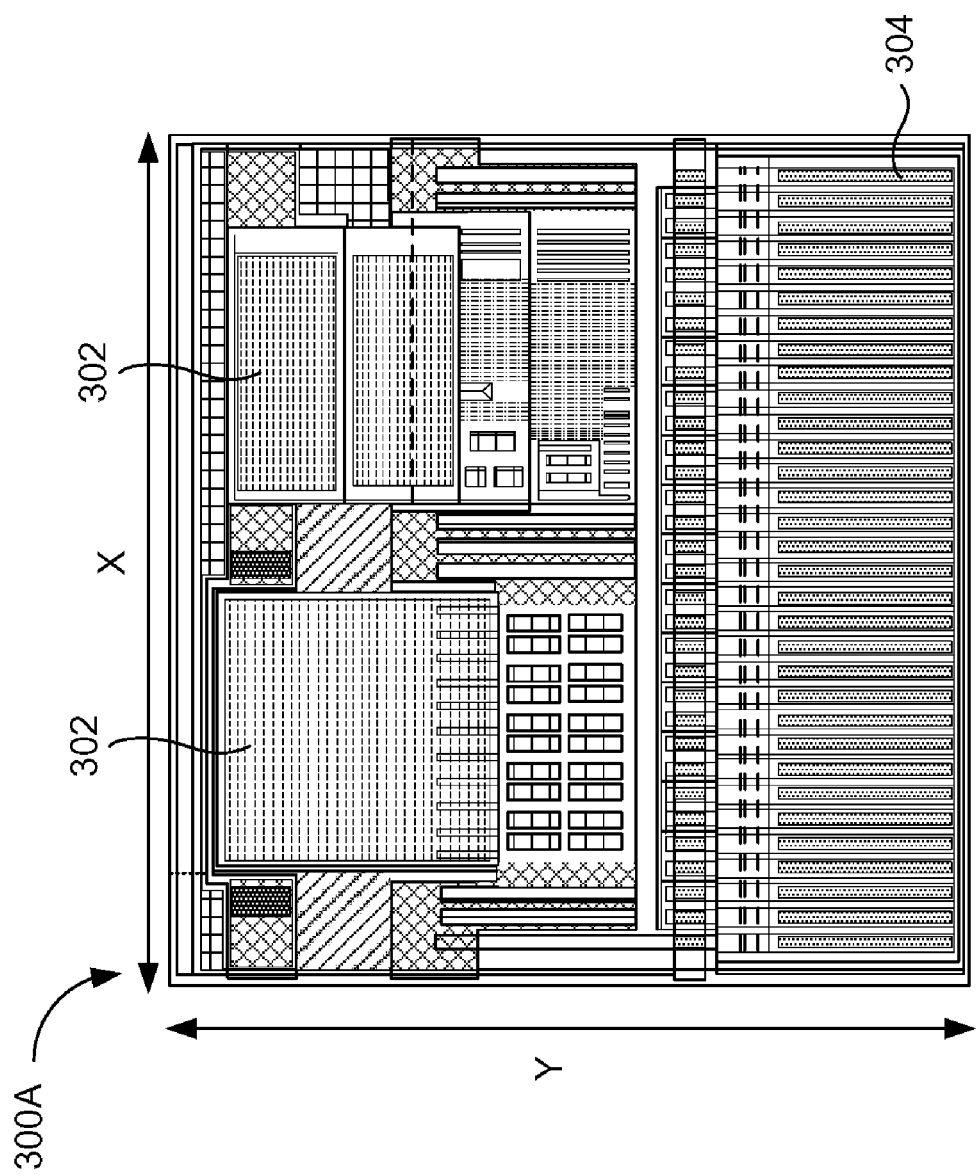
FIG. 3A illustrates a silicon area optimized pad according to an embodiment herein.

FIG. 3A illustrates a silicon area optimized pad 300A having dimensions x and y according to an embodiment herein. The silicon area optimized pad 300A includes stacks of circuits 302, and relatively short ESD cells 304 that are mounted on the IC (not shown in FIG. 3A). In one embodiment, the chip has 4N pins, where N is the number of pins on each side of the pad 300A. Assuming the silicon core area equals Lc·Lc. Lc is the length of the silicon core. In another embodiment, the pad circuit area is assumed to be Ap. The silicon area optimized area 300A includes dimensions x and y. The dimension x multiplied by the dimension y equals the pad circuit area Ap. The pad circuit area Ap is in accordance with Equation (1):

$$x \cdot y = Ap \quad (1)$$

The length of the silicon core equals the number of pins on each side N multiplied by the dimension x. The length of the silicon core is determined in accordance with the Equation (2):

$$N \cdot x = Lc \quad (2)$$

Thus, the optimum pad dimensions are calculated in accordance with the Equations (3) and (4):

$$x = Lc/N \quad (3)$$

and $$y = Ap \cdot N/Lc \quad (4)$$

Figure 3B:
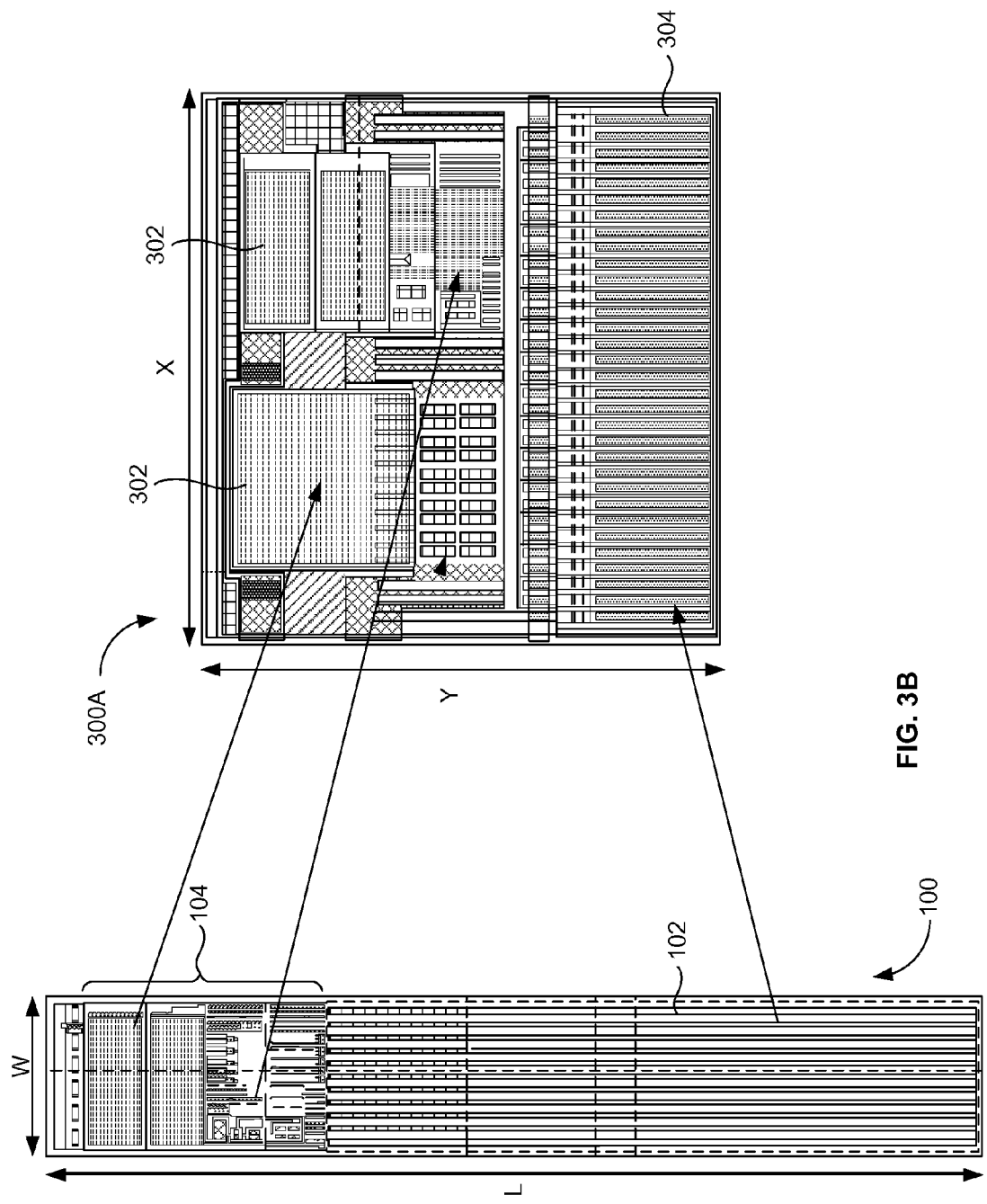
FIG. 3B illustrates an optimized chip pad re-layout according to an embodiment herein.

FIG. 3B illustrates a re-layout of the traditional pin count pad 100 of FIG. 1 and mounting the stack of circuits 302 and the short ESD cells 304 on the silicon area optimized pad 300A of FIG. 3A according to an embodiment herein. The relatively long ESD cells 104 are converted to relatively short ESD cells 304 as shown in FIG. 3B. In one embodiment, the silicon area optimized pad is mounted on the IC (not shown in FIG. 3B). The IC includes a chip core (not shown in FIG. 3B). The stack of circuits 302 and the short ESD cells 304 are dimensioned and configured to fit in the silicon area optimized pad 300A based on the determined x and y dimensions. In one embodiment, more cells can be added based on the calculated dimensions x and y where the value of y is calculated from Equation (4).

Figure 2:
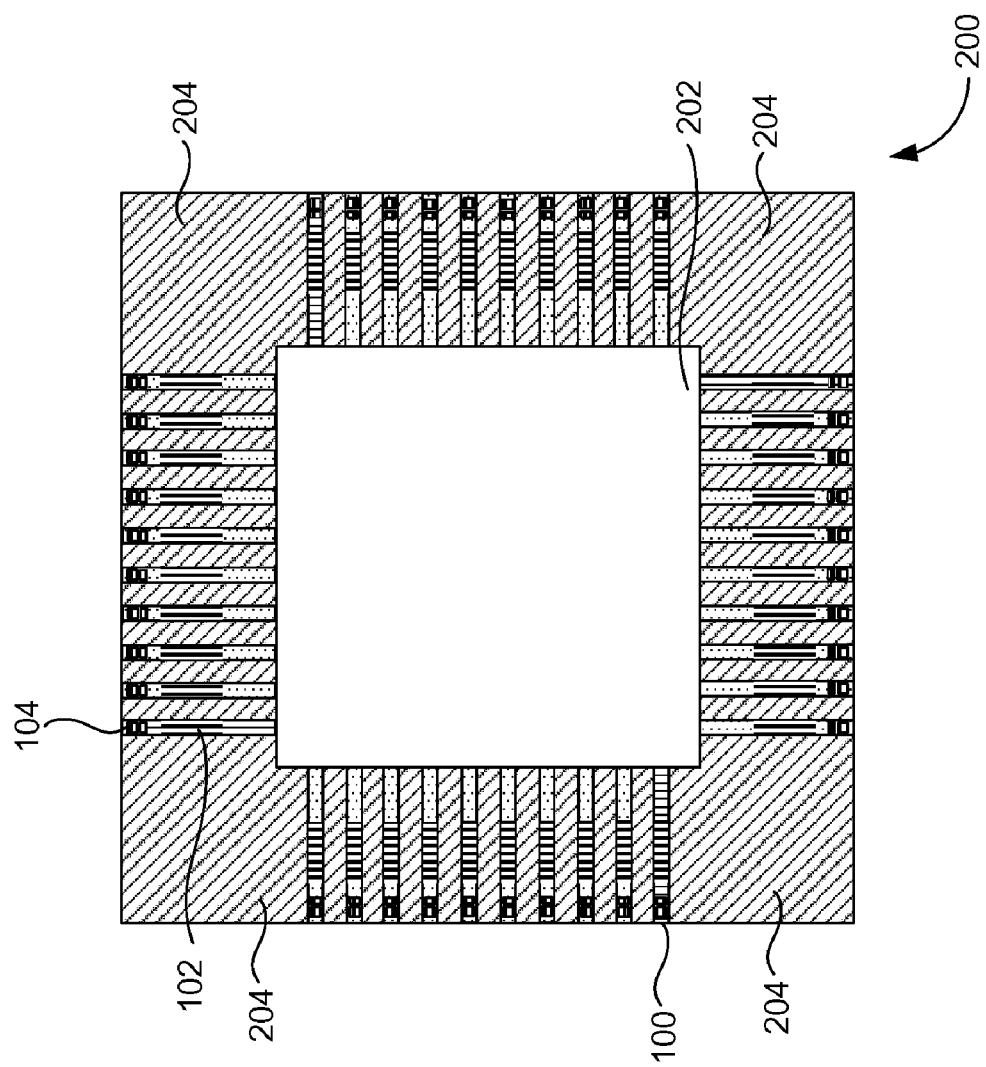
FIG. 2 illustrates a traditional integrated circuit chip.
Figure 4:
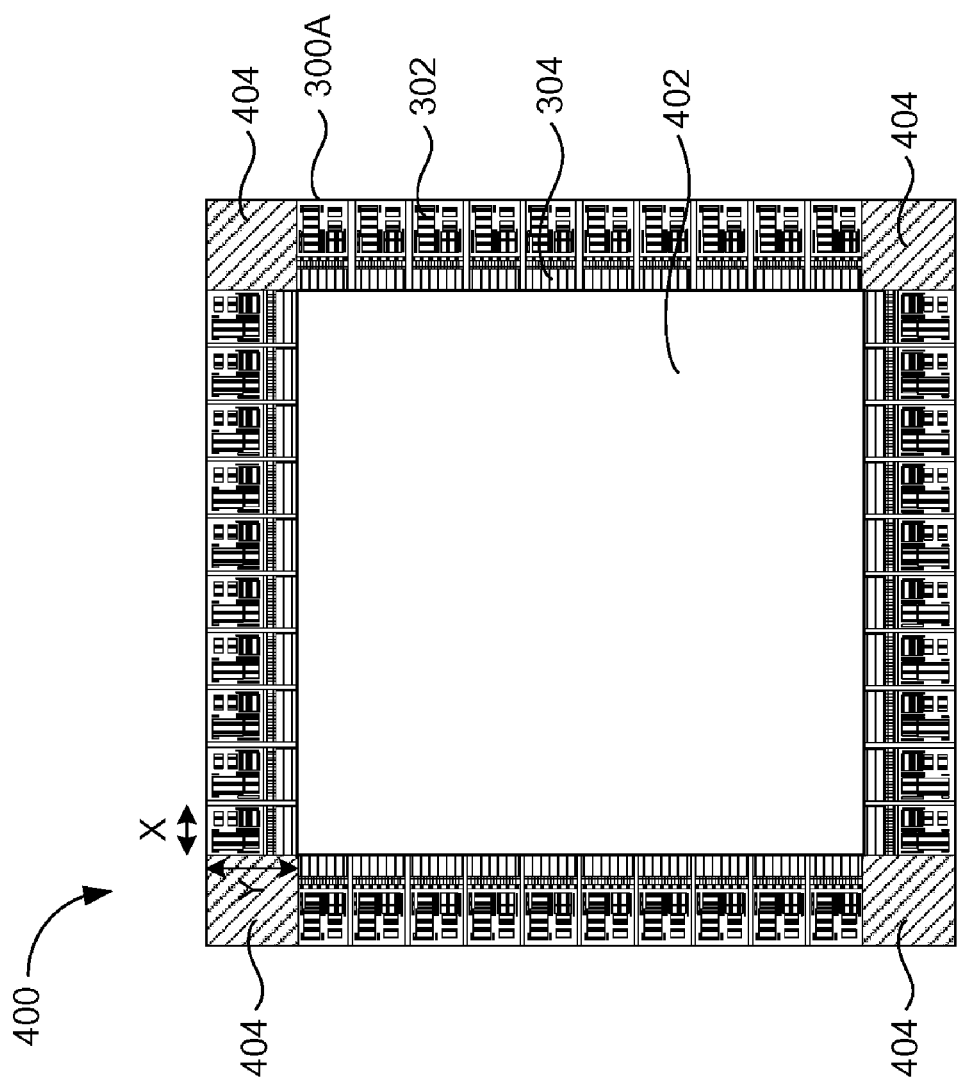
FIG. 4 illustrates an optimized integrated circuit chip according to an embodiment herein.

With reference to FIG. 3A and FIG. 3B, FIG. 4 illustrates an IC chip 400 having a number of silicon area optimized pads 300A, the stack of circuits 302, the short ESD cells 304, a chip core 402, and a wasted area 404 according to an embodiment herein. The numbers of silicon area optimized pads 300A are mounted on the IC. The dimension x is in a direction perpendicular to the chip core 402. The dimension y is in a direction parallel to the chip silicon 402. The dimension x and y are determined based on an area required to fit the short ESD cells 304 and additional circuits needed in the silicon area optimized pad 300A. This minimizes and/or optimizes the chip area with a high gain in the chip area. In an example embodiment, the overall wasted area 404 is significantly less as compared to the overall wasted area 204 of FIG. 2.

In one embodiment, the pad 300A comprises a length equal to approximately ⅙ a width of the chip core 402, and the pad 300A comprises a length equal to approximately ⅙ a length of the chip core 402. In another embodiment, the pad 300A comprises ESD cells 304 having a length equal to approximately 1/16 a length of the chip core 402, and the pad 300A comprises ESD cells having a length equal to approximately 1/16 a width of the chip core 402. Moreover, the pins have a longitudinal axis positioned parallel to the chip core 402.

Figure 5:
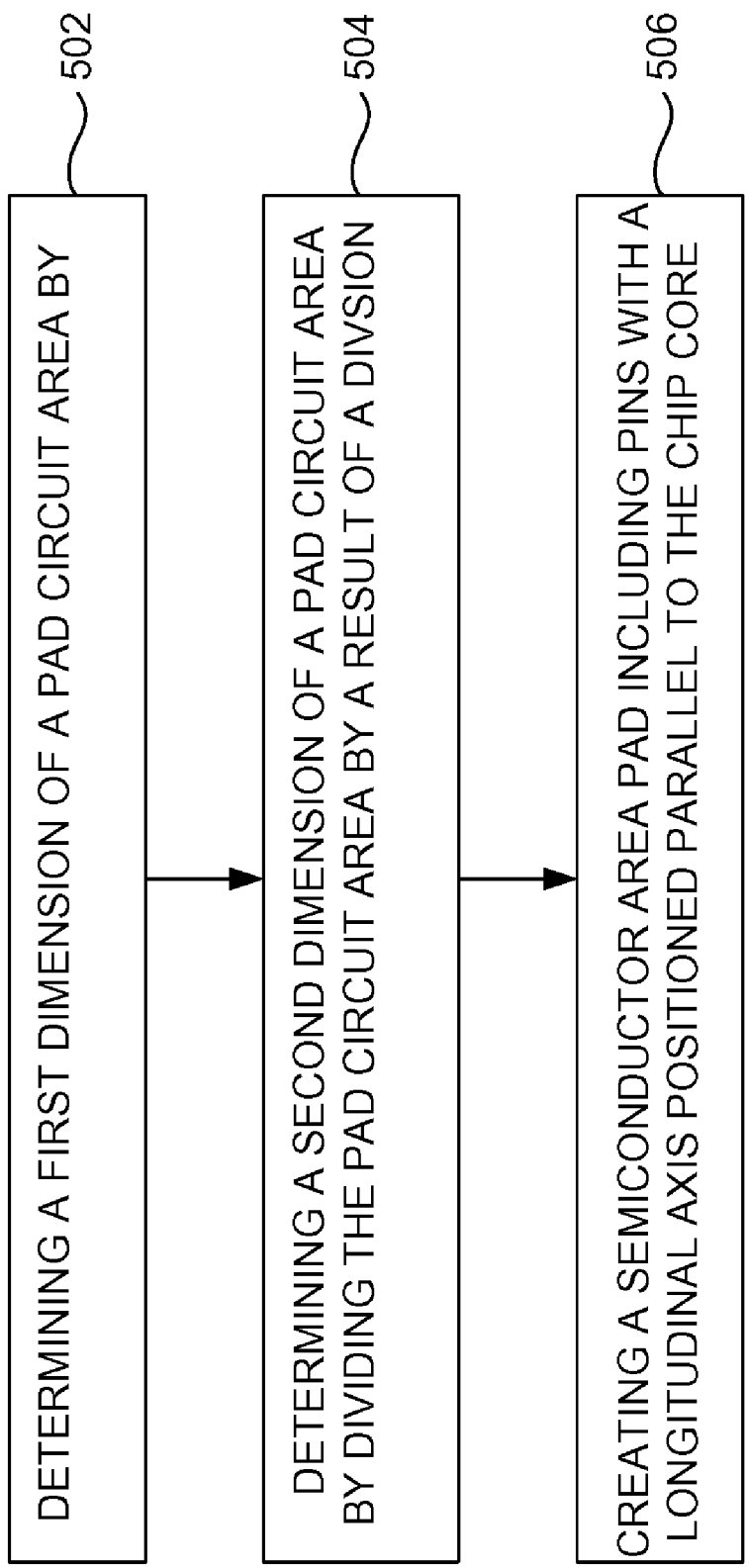
FIG. 5 is a flow diagram illustrating a method of optimizing a semiconductor chip pad configuration according to an embodiment herein.

FIG. 5 with reference to FIG. 3A through FIG. 4 is a flow diagram illustrating a method of optimizing a semiconductor chip pad configuration according to an embodiment herein. The pad 300A includes a pad circuit area Ap, a first dimension x and a second dimension y, in a chip having N number of pins on each side. The pins include a longitudinal axis, and the chip includes a chip core 402 of length Lc. In step 502, the first dimension x is determined by dividing the length Lc by the N. In step 504, the second dimension is determined y by dividing the pad circuit area Ap by a result of a division of the length Lc by the N. In step 506, a semiconductor area pad 300A is created that includes pins with the longitudinal axis positioned parallel to the chip core 402.

A stack of circuits 302 is designed in the chip to fit in the pad 300A based on the first dimension x and the second dimension y. The pad 300A includes a length equal to approximately ⅙ a width of the chip core 402, and a length equal to approximately ⅙ a length of the chip core 402. These dimensions are counter intuitive to those skilled in the art because typically, a pad 100 has a length that is greater than both the length and width of a chip core 202, whereas the embodiments herein provide a pad 300A that has a length that is a fraction of the length of the chip core 402 and also has a length that is a fraction of the width of the chip core 402. The pad 300A further includes ESD cells 304 having a length equal to approximately 1/16 a length of the chip core 402, and a length equal to approximately 1/16 a width of the chip core 402. These dimensions are counter intuitive to those skilled in the art because typically, ESD cells 104 have a length that is greater than both the length and width of a chip core 202, whereas the embodiments herein provide ESD cells 304 that have a length that is a fraction of the length of the chip core 402 and also has a length that is a fraction of the width of the chip core 402. The first dimension x is in a direction perpendicular to the chip core 402. The second dimension y is in a direction parallel to the chip core 402. The semiconductor chip pad configuration may be configured in a handheld device (not shown).

The calculated dimensions x and y optimizes the chip pad 300A such that it minimizes the chip area. The dimensions x and y are calculated based on the pad circuit area Ap, the length of the silicon core side Lc, and the number of pins N of a chip on each side. The dimension x equals Lc divided by N, and the dimension y equals Ap multiplied by N and divided by Lc. The chip pad 300A thus configured has a maximum chip area and a minimum wasted area 404. The embodiments herein may be used in handheld devices including, for example, analog television handheld receivers as well as other types of handheld and non-handheld devices.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method of optimizing a semiconductor chip pad configuration, wherein said pad comprises a pad circuit area Ap, a first dimension x, and a second dimension y, in a chip having N number of pins on each side, wherein said pins comprise a longitudinal axis, and wherein said chip comprises a chip core of length Lc, said method comprising:
determining said first dimension x by dividing said length Lc by said N;
determining said second dimension y by dividing said pad circuit area Ap by a result of a division of said length Lc by said N; and
creating a semiconductor area pad comprising pins with said longitudinal axis positioned parallel to said chip core.

2. The method of claim 1, further comprising designing a stack of circuits in said chip to fit in said pad based on said first dimension x and said second dimension y.

3. The method of claim 1, wherein said pad comprises a length equal to approximately ⅙ a width of said chip core, and wherein said pad comprises a length equal to approximately ⅙ a length of said chip core.

4. The method of claim 1, wherein said pad comprises electrostatic discharge (ESD) cells having a length equal to approximately 1/16 a length of said chip core, and wherein said pad comprises electrostatic discharge (ESD) cells having a length equal to approximately 1/16 a width of said chip core.

5. The method of claim 1, wherein said first dimension x is in a direction perpendicular to said chip core.

6. The method of claim 5, wherein said second dimension y is in a direction parallel to said chip core.

7. The method of claim 1, further comprising creating said semiconductor chip pad configuration in a handheld device.

8. An integrated circuit comprising:
a semiconductor core of length Lc;
a plurality of sides of said core each having N number of pins; and
a plurality of semiconductor area chip pads, wherein each pad comprises:
a first dimension x that is determined by dividing said length Lc by said N; and
a second dimension y that is determined by dividing an area of said pad Ap by a result of a division of said length Lc by said N,
a stack of circuits that fit in said pad based on said first dimension x and said second dimension y,
wherein said pins comprise a longitudinal axis positioned parallel to said semiconductor core.

9. The integrated circuit of claim 8, wherein said pad comprises a length equal to approximately ⅙ a width of said chip core, and wherein said pad comprises a length equal to approximately ⅙ a length of said chip core.

10. The integrated circuit of claim 8, wherein said pad comprises electrostatic discharge (ESD) cells having a length equal to approximately 1/16 a length of said chip core, and wherein said pad comprises electrostatic discharge (ESD) cells having a length equal to approximately 1/16 a width of said chip core.

11. The integrated circuit of claim 8, wherein said first dimension x is in a direction perpendicular to said semiconductor core.

12. The integrated circuit of claim 11, wherein said second dimension y is in a direction parallel to said semiconductor core.

13. A semiconductor area optimized integrated circuit chip pad having an area Ap mounted in a chip having N number of pins on each side, wherein said chip comprises a semiconductor core of length Lc, said semiconductor area optimized pad comprising:
a first dimension x that is determined by dividing said length Lc by said N; and
a second dimension y that is determined by dividing said area of said semiconductor area optimized pad Ap by a result of a division of said length Lc by said N,
wherein said pins comprise a longitudinal axis positioned parallel to said semiconductor core.

14. The chip pad of claim 13, wherein said chip further comprises a stack of circuits that fit in said semiconductor area optimized pad based on said first dimension x and said second dimension y.

15. The chip pad of claim 13, wherein said first dimension x is in a direction perpendicular to said semiconductor core.

16. The chip pad of claim 15, wherein said second dimension y is in a direction parallel to said semiconductor core.

17. The chip pad of claim 13, wherein said pad comprises a length equal to approximately ⅙ a width of said semiconductor core.

18. The chip pad of claim 13, wherein said pad comprises a length equal to approximately ⅙ a length of said semiconductor core.

19. The chip pad of claim 13, wherein said pad comprises electrostatic discharge (ESD) cells having a length equal to approximately 1/16 a length of said semiconductor core.

20. The chip pad of claim 13, wherein said pad comprises electrostatic discharge (ESD) cells having a length equal to approximately 1/16 a width of said semiconductor core.

* * * * *